(12) United States Patent
Chang et al.

(10) Patent No.: US 7,772,901 B2
(45) Date of Patent: Aug. 10, 2010

(54) SLEW RATE CONTROL CIRCUIT

(75) Inventors: Yaw-Guang Chang, Tainan (TW); Lieh-Chiu Lin, Tainan (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/350,924

(22) Filed: Jan. 8, 2009

(65) Prior Publication Data
US 2010/0171539 A1    Jul. 8, 2010

(51) Int. Cl.
*H03K 5/12* (2006.01)
(52) U.S. Cl. ........................................ 327/170
(58) Field of Classification Search ............. 327/170
See application file for complete search history.

(56) References Cited

U.S. PATENT DOCUMENTS

| | | | | |
|---|---|---|---|---|
| 4,749,882 A * | 6/1988 | Morgan | ........ | 327/170 |
| 5,315,172 A * | 5/1994 | Reddy | ........ | 326/27 |
| 5,656,960 A * | 8/1997 | Holzer | ........ | 327/170 |
| 5,777,944 A * | 7/1998 | Knaack et al. | ........ | 365/230.06 |
| 5,898,321 A * | 4/1999 | Ilkbahar et al. | ........ | 326/87 |
| 5,977,790 A * | 11/1999 | Sanwo et al. | ........ | 326/27 |
| 6,177,819 B1 * | 1/2001 | Nguyen | ........ | 327/112 |
| 6,225,844 B1 * | 5/2001 | Fujiwara | ........ | 327/170 |
| 6,400,177 B1 * | 6/2002 | Yoshizaki | ........ | 326/30 |
| 6,483,340 B2 * | 11/2002 | Uenishi | ........ | 326/27 |
| 7,187,197 B2 * | 3/2007 | Tripathi et al. | ........ | 326/29 |
| 7,449,936 B2 * | 11/2008 | Shin et al. | ........ | 327/378 |
| 2004/0113670 A1 * | 6/2004 | Arai | ........ | 327/170 |

\* cited by examiner

*Primary Examiner*—Lincoln Donovan
*Assistant Examiner*—William Hernandez
(74) *Attorney, Agent, or Firm*—Stout, Uxa, Buyan & Mullins, LLP

(57) ABSTRACT

A slew rate control circuit is disclosed. An output impedance buffer and a slew rate buffer are coupled in parallel. An edge detector detects an input signal to accordingly control the output impedance buffer and the slew rate buffer, such that the input signal passes through the slew rate buffer during a rising or falling time period, and the input signal only passes through the output impedance buffer during a stable time period, thereby conforming to specification requirements for the slew rate and the output impedance at the same time.

15 Claims, 4 Drawing Sheets

SLEW RATE CONTROL CIRCUIT

BACKGROUND OF THE INVENTION

1. Field of the Invention

The present invention generally relates to the output stage of a circuit, and more particularly to a slew rate control circuit for a high-speed low-power transmitter.

2. Description of the Prior Art

A Mobile Industry Processor Interface (MIPI) is a high-speed low-power (LP) serial transceiver interface developed to support interconnections of low-power high-speed mobile applications such as for digital camera, display or other portable devices. A D-PHY specification further defines physical layer devices that transport high-speed data on the link between the transmitters and the receivers.

The MIPI specification regulates, among other things, the slew rate and the output impedance ($R_{out}$) of a transmitter (Tx).

The slew rate is the maximum rate of change of a signal in a circuit. Low slew rate causes signal distortion. On the other hand, the output impedance of a transmitter should be as large as possible such that the output of the transmitter may not be affected by an external load. In general, for designing a practical circuit, such as the MIPI low-power transmitter (LP Tx) mentioned above, a compromise between the slew rate and the output impedance should be reached. According to the MIPI specification, the slew rate of a transmitter with a load of capacitance of 0-70 pF should be within a specific range, and the output impedance should be not less than a specific value. In order to be in conformity with both the slew rate and the output impedance, the design of a MIPI low-power transmitter thus becomes complex and costly.

FIG. 1 shows a schematic circuit illustrating the output stage of a MIPI transmitter. In the figure, a capacitor 10 and a resistor 12 are connected between the output node and the input node as shown to compromisingly arrive at an acceptable slew rate and output impedance. Unfortunately, when the external load increases, the transmitter may necessarily be designed to increase its output to maintain the slew rate, while disadvantageously decreasing its output impedance at the same time. In other words, the slew rate and the output impedance usually affect each other in a manner that a designer would prefer mostly to avoid.

For the reason that conventional circuit, such as a MIPI transmitter, could not be effectively designed without using complex circuitry to reach an acceptable tradeoff between the slew rate and the output impedance, a need thus has arisen to propose a high-speed interface circuit that can take account of the slew rate and the output impedance at the same time.

SUMMARY OF THE INVENTION

In view of the foregoing, it is an object of the present invention to provide an uncomplicated and inexpensive interface circuit that is capable of making the output stage of a circuit, such as a low-power transmitter, conform to specification requirements for the slew rate and the output impedance at the same time.

According to one embodiment, an output impedance buffer and a slew rate buffer are coupled in parallel, and the output of the output impedance buffer and the output of the slew rate buffer are added to be an output of the whole slew rate control circuit. An edge detector detects an input signal to accordingly control the output impedance buffer and the slew rate buffer. As a result, the input signal passes through the slew rate buffer during a rising or falling time period, during which the output of the slew rate control circuit is rising or falling toward a substantial proportion of a required level; the input signal only passes through the output impedance buffer during a stable time period, during which the output of the slew rate control circuit is substantially maintained at a required high or low level. Accordingly, the slew rate and the output impedance of the slew rate control circuit can be in conformity with the specification requirements of, for example, the MIPI specification, at the same time.

DETAILED DESCRIPTION OF THE INVENTION

Figure 1:
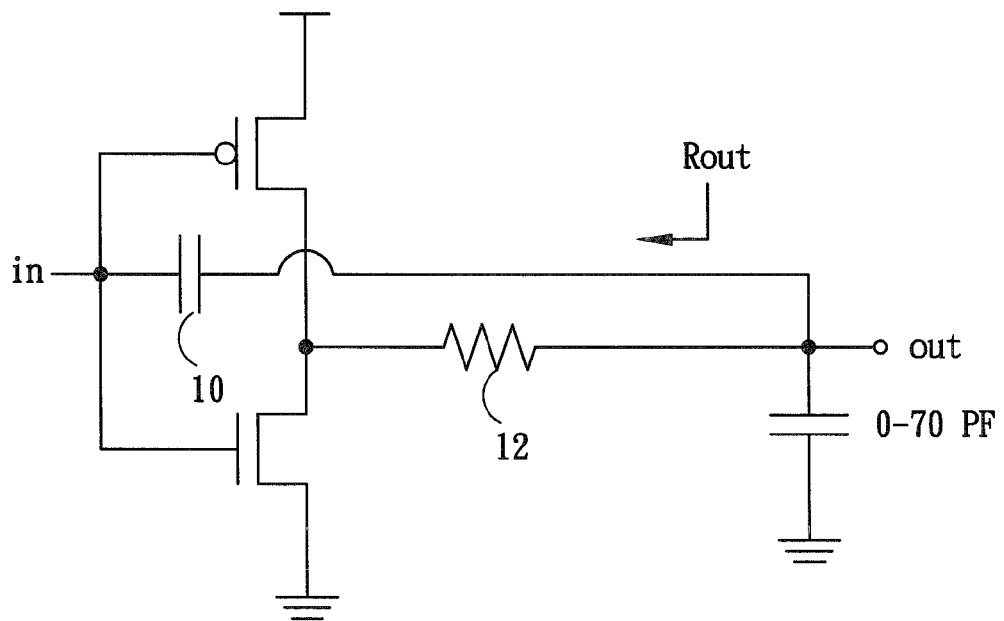
FIG. 1 shows a schematic circuit illustrating the output stage of a conventional MIPI transmitter (Tx)
Figure 2:
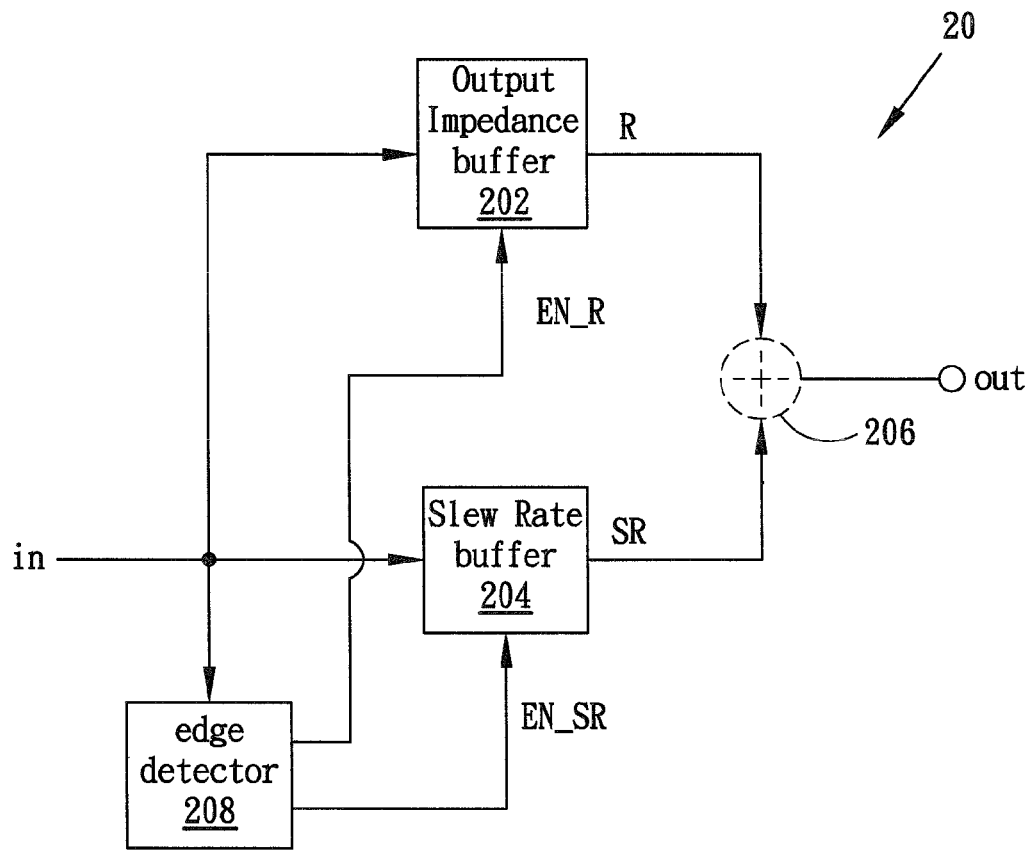
FIG. 2 is a block diagram of a slew rate control circuit according to one embodiment of the present invention.
Figure 3:
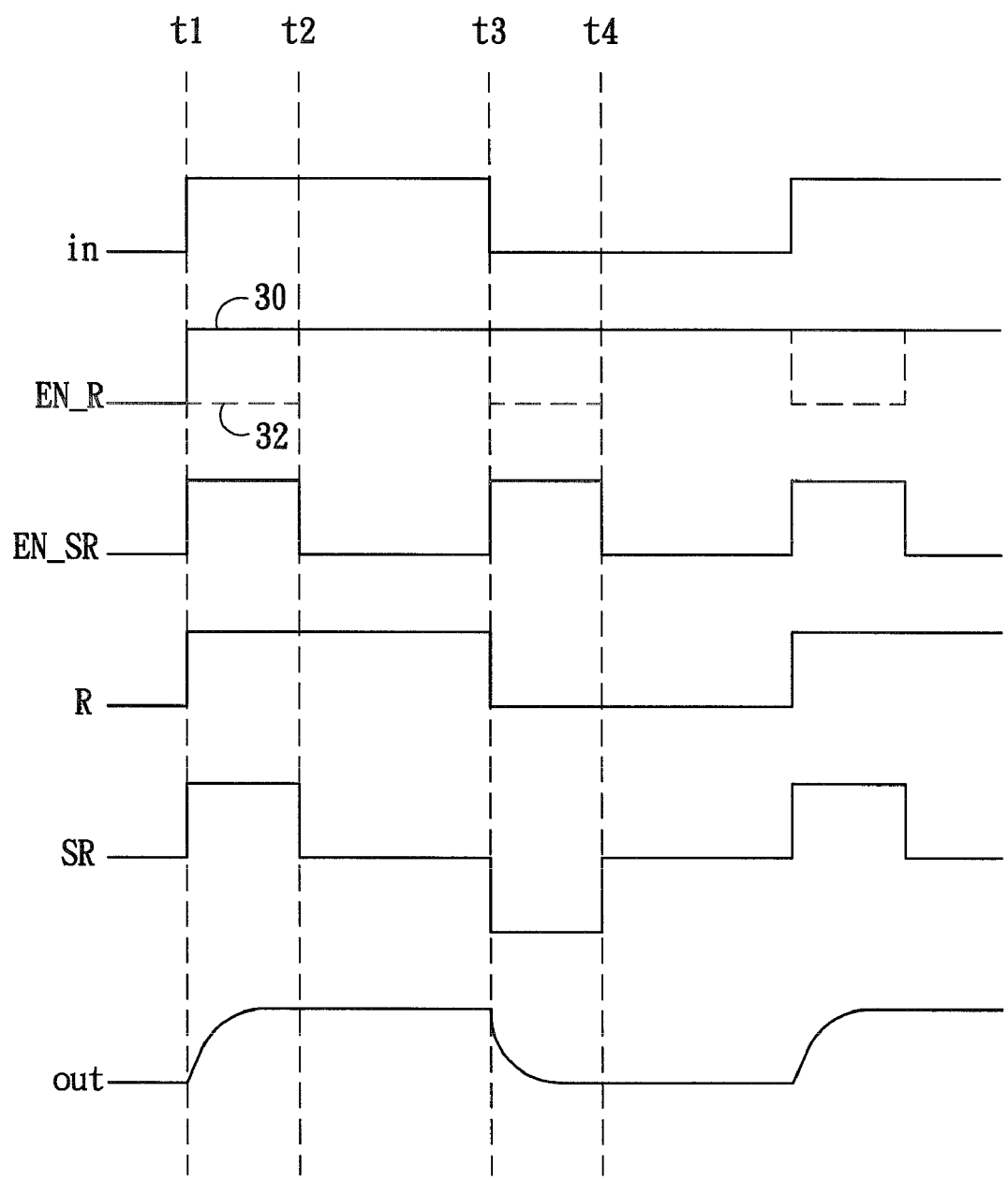
FIG. 3 shows various signal waveforms associated with the slew rate control circuit of FIG. 2.

FIG. 2 illustrates in block-diagram format a slew rate control circuit 20 according to one embodiment of the present invention, and FIG. 3 shows various signal waveforms associated with the slew rate control circuit 20. It is appreciated that an input signal (in) having a waveform other than the depicted square wave, such as a sinusoidal wave, may also be processed by the slew rate control circuit 20. The slew rate control circuit 20 is capable of making the output stage of a circuit, such as a low-power transmitter, conform to the specification requirements for the slew rate and the output impedance at the same time. Although the embodiment is described in the context of applying a Mobile Industry Processor Interface (MIPI) specification, which is a high-speed low-power (LP) serial transceiver interface developed to support interconnections of low-power high-speed mobile applications, the present invention can be well adapted to other transceivers or, in general, the output stage of a circuit.

In the embodiment, the slew rate control circuit 20 includes an output impedance ($R_{out}$) buffer 202 that conforms to the output impedance specification requirement of, for example, the MIPI specification. The slew rate control circuit 20 also includes a slew rate buffer 204 that conforms to the slew rate specification requirement of the MIPI specification. The output impedance buffer 202 and the slew rate buffer 204 are coupled in parallel such that the respective input nodes are connected together to receive an input signal (in), and the output (R) of the output impedance buffer 202 and the output (SR) of the slew rate buffer 204 are added up as the output signal (out) of the slew rate control circuit 20. In practice, the output nodes of the output impedance buffer 202 and the slew rate buffer 204 may be coupled together to perform the addition without using any real adder 206.

The slew rate control circuit 20 further includes an edge detector 208 that detects the rising edges and the falling edges of the input signal (in). In the embodiment, the edge detector 208 generates at least an output impedance enable signal EN_R and a slew rate enable signal EN_SR according to the rising/falling edges. The output impedance enable signal EN_R is used to enable the output impedance buffer 202, and the slew rate enable signal EN_SR is used to enable the slew rate buffer 204. As shown in FIG. 3, the slew rate enable signal EN_SR becomes active, or high, for a specific period of time whenever the input signal (in) is rising or falling, for example, during a period from t1 to t2. The specific period of time is set to be long enough for the output signal (out) to rise or fall a substantial proportion (for example, 80%) of the required level. The output impedance enable signal EN_R becomes active, or high, whenever the input signal (in) is stable, for example, during a period from t2 to t3. The output impedance enable signal EN_R may be active or inactive when the input signal (in) is rising or falling, for example, during the period from t1 to t2. In one embodiment, the output impedance enable signal EN_R (30) is always active. In another embodiment, the output impedance enable signal EN_R (32) becomes active only when the slew rate enable signal EN_SR becomes inactive, or low.

According to FIG. 3, when the rising edge is detected (for example, at time t1), the slew rate buffer 204 is enabled (by the active signal EN_SR) such that the input signal (in) primarily passes through the slew rate buffer 204, which provides a greater slew rate than the output impedance buffer 202. In one embodiment, the input signal (in) passes through both the slew rate buffer 204 and the output impedance buffer 202 at time t1. In another embodiment, the input signal (in) only passes through the slew rate buffer 204 at time t1. At this time, the output (SR), or slew rate, of the slew rate buffer 204 is pulled high, and the output signal (out) thus rises correspondingly with a slew rate large enough to be in conformity with the MIPI specification.

Subsequently, for example, at time t2, the signal EN_SR becomes inactive to disable the slew rate buffer 204, and the output (SR) of the slew rate buffer 204 is off or with high impedance (Hi-Z). At this time, the input signal (in) solely passes through the output impedance buffer 202, and the output signal (out) thus stays high with an output impedance large enough to be in conformity with the MIPI specification.

When the falling edge is detected (for example, at time t3), the slew rate buffer 204 is enabled again (by the active signal EN_SR) such that the input signal (in) primarily passes through the slew rate buffer 204. At this time, the output (SR) of the slew rate buffer 204 is pulled low, and the output signal (out) thus falls correspondingly with a slew rate large enough to be in conformity with the MIPI specification.

Subsequently, for example, at time t4, the signal EN_SR becomes inactive again to disable the slew rate buffer 204, and the output (SR) of the slew rate buffer 204 is off or with high impedance (Hi-Z). At this time, the input signal (in) solely passes through the output impedance buffer 202, and the output signal (out) thus stays low with an output impedance large enough to be in conformity with the MIPI specification.

According to the embodiment discussed above, the input signal (in) primarily passes through the slew rate buffer 204 during the rising/falling time period (for example, t1 to t2) such that the slew rate specification requirement of, for example, the MIPI specification, can be met. Subsequently, the input signal (in) solely passes through the output impedance buffer 202 during the stable time period (for example, t2 to t3) such that the output impedance specification requirement of, for example, the MIPI specification, can be met.

Figure 4:
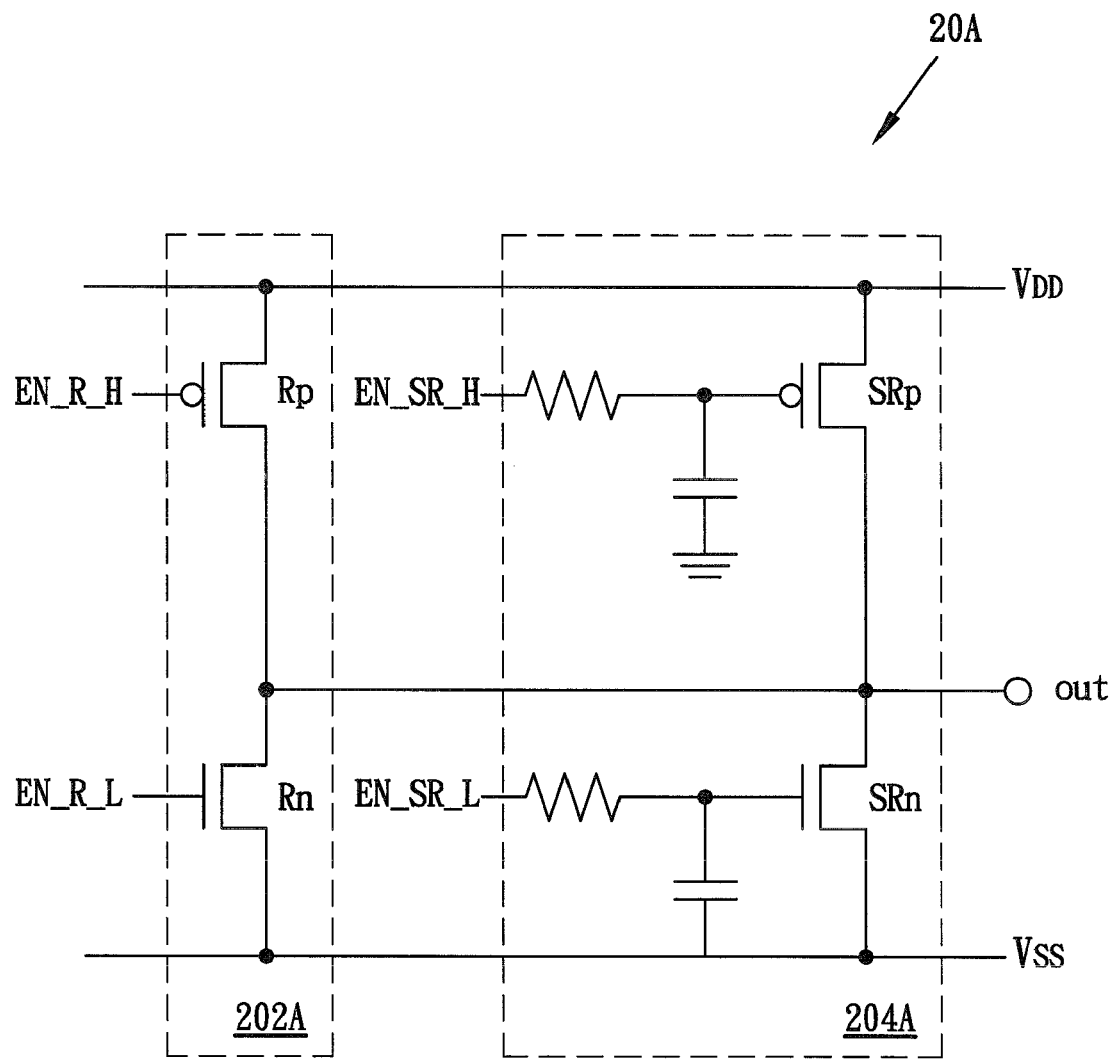
FIG. 4 shows a schematic circuit illustrating an exemplary slew rate control circuit according to one embodiment of the present invention.
Figure 4:
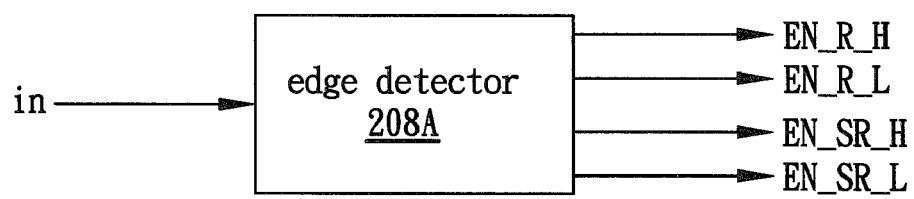
Figure 5:
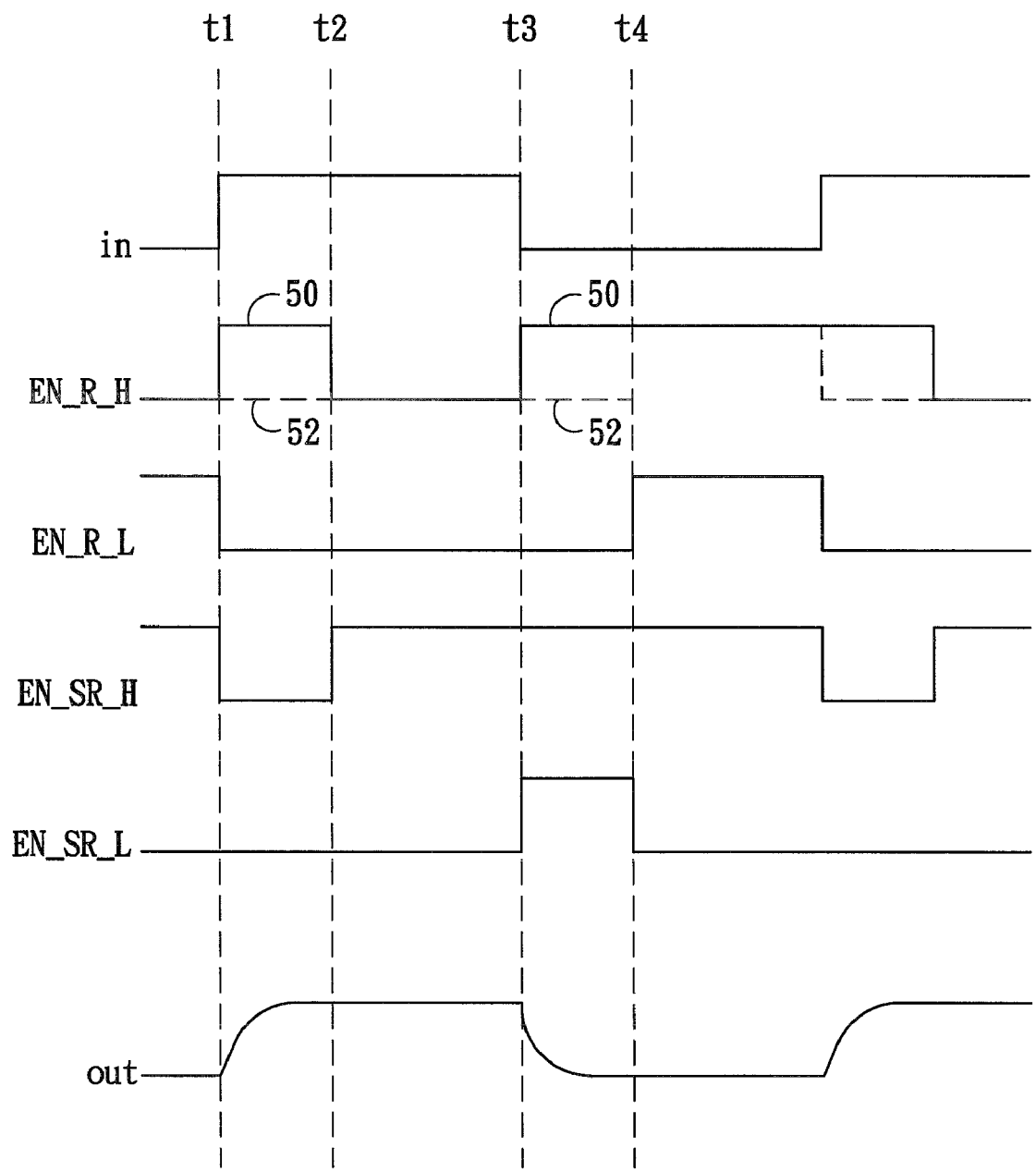
FIG. 5 shows various signal waveforms associated with the slew rate control circuit of FIG. 4.

FIG. 4 shows a schematic circuit illustrating an exemplary slew rate control circuit 20A according to one embodiment of the present invention, and FIG. 5 shows various signal waveforms associated with the slew rate control circuit 20A. In the embodiment, the slew rate control circuit 20A includes an output impedance buffer 202A that conforms to the output impedance specification requirement of, for example, the MIPI specification. The output impedance buffer 202A includes a p-type transistor Rp and an n-type transistor Rn connected in series between a positive power supply $V_{DD}$ and a negative power supply $V_{SS}$. The slew rate control circuit 20A also includes a slew rate buffer 204A that conforms to the slew rate specification requirement of the MIPI specification. The slew rate buffer 204A includes a p-type transistor SRp and an n-type transistor SRn connected in series between the positive power supply $V_{DD}$ and the negative power supply $V_{SS}$. The output impedance buffer 202A and the slew rate buffer 204A are coupled in parallel between the positive power supply $V_{DD}$ and the negative power supply $V_{SS}$. The interconnection node of the transistors SRp and SRn is coupled to the interconnection node of the transistors Rp and Rn, and is used as the output (out).

The slew rate control circuit 20A further includes an edge detector 208A that receives and detects the rising edges and the falling edges of the input signal (in). In the embodiment, the edge detector 208A generates output impedance enable signals EN_R_H and EN_R_L coupled respectively to the transistors Rp and Rn, and generates slew rate enable signals EN_SR_H and EN_SR_L coupled respectively to the transistors SRp and SRn according to the rising/falling edges. The output impedance enable signals EN_R_H and EN_R_L are together used to enable the output impedance buffer 202A, and the slew rate enable signals EN_SR_H and EN_SR_L are together used to enable the slew rate buffer 204A.

According to FIG. 5, when the rising edge is detected (for example, at time t1), the slew rate buffer 204A is enabled with low (0) slew rate enable signals EN_SR_H and EN_SR_L, such that the output signal (out) is pulled high. Equivalently speaking, the input signal (in) is regenerated through the slew rate buffer 204A. At this time, the output impedance buffer 202A is disabled with high (1) output impedance enable signal EN_R_H (50) and low (0) enable signal EN_R_L. In another embodiment, the output impedance buffer 202A is also enabled with low (0) output impedance enable signals EN_R_H (52) and EN_R_L.

Subsequently, for example, at time t2, the slew rate buffer 204A is disabled with high (1) slew rate enable signal EN_SR_H and low (0) enable signal EN_SR_L, such that the slew rate buffer 204A has high impedance (Hi-Z). At this time, the output impedance buffer 202A is enabled with low (0) output impedance enable signals EN_R_H and EN_R_L, such that the output signal (out) is kept high. Equivalently speaking, the input signal (in) is regenerated through the output impedance buffer 202A.

When the falling edge is detected (for example, at time t3), the slew rate buffer 204A is enabled again with high (1) slew rate enable signals EN_SR_H and EN_SR_L, such that the output signal (out) is pulled low. At this time, the output impedance buffer 202A is disabled with high (1) output impedance enable signal EN_R_H (50) and low (0) enable signal EN_R_L. In another embodiment, the output impedance buffer 202A is also enabled with low (0) output impedance enable signals EN_R_H (52) and EN_R_L.

Subsequently, for example, at time t4, the slew rate buffer 204A is disabled with high (1) slew rate enable signal EN_SR_H and low (0) enable signal EN_SR_L, such that the slew rate buffer 204A has high impedance (Hi-Z). At this time, the output impedance buffer 202A is enabled with high (1) output impedance enable signals EN_R_H and EN_R_L, such that the output signal (out) is kept low.

It is noted, in the embodiment, that the slew rate buffer 204A should avoid shorting between $V_{DD}$ and $V_{SS}$ with low (0) slew rate enable signal EN_SR_H and high (1) enable signal EN_SR_L. The output impedance buffer 202A should also avoid shorting between $V_{DD}$ and $V_{SS}$ with low (0) output impedance enable signal EN_R_H and high (1) enable signal EN_R_L.

The input signal (in), the output signal (out), the various enable signals, and the buffers 202A and 204A in different times are summarized in the following Table 1.

TABLE 1

|  | t1 | t2 | t3 | t4 |
|---|---|---|---|---|
| in | rising | high | falling | low |
| $R_{out}$ buffer | disabled, Hi-Z or enabled, pull high | enabled, pull high | disabled, Hi-Z or enabled, pull low | enabled, pull low |
| EN_R_H | 1/0 | 0 | 1 | 1 |
| EN_R_L | 0/0 | 0 | 0 | 1 |
| SR buffer | enabled, pull high | disabled, Hi-Z | enabled, pull low | disabled, Hi-Z |
| EN_SR_H | 0 | 1 | 1 | 1 |
| EN_SR_L | 0 | 0 | 1 | 0 |
| out | rising | high | falling | low |

According to the embodiment discussed above, the input signal (in) primarily passes through the slew rate buffer 204A during the rising/falling time period such that the slew rate specification requirement of, for example, the MIPI specification, can be met. Subsequently, the input signal (in) solely passes through the output impedance buffer 202A during the stable time period such that the output impedance specification requirement of, for example, the MIPI specification, can be met.

Although specific embodiments have been illustrated and described, it can be appreciated by those skilled in the art that various modifications may be made without departing from the scope and spirit of the present invention, which is intended to be limited solely by the appended claims.

What is claimed is:

1. A slew rate control circuit, comprising:
an output impedance buffer;
a slew rate buffer coupled in parallel to the output impedance buffer; and
an edge detector that detects an input signal to accordingly control the output impedance buffer and the slew rate buffer, such that the input signal passes through the slew rate buffer during a rising or falling time period, and the input signal only passes through the output impedance buffer during a stable time period;
wherein the edge detector, according to rising or falling of the input signal, generates at least one output impedance enable signal to enable the output impedance buffer, and at least one slew rate enable signal to enable the slew rate buffer.

2. The slew rate control circuit of claim 1, wherein an output of the output impedance buffer and an output of the slew rate buffer are added to be an output of the slew rate control circuit.

3. The slew rate control circuit of claim 2, wherein the output of the slew rate control circuit is rising or falling toward a substantial proportion of a required level during the rising or falling time period, and the output of the slew rate control circuit is substantially maintained at a high or low level during the stable time period.

4. The slew rate control circuit of claim 1, wherein the input signal further passes through the output impedance buffer during the rising or falling time period.

5. The slew rate control circuit of claim 1, wherein an output impedance and slew rate of the slew rate control circuit are in conformity with Mobile Industry Processor Interface (MIPI) specifications.

6. The slew rate control circuit of claim 1, wherein the output impedance buffer has an output impedance greater than the slew rate buffer, and the slew rate buffer has a slew rate greater than the output impedance buffer.

7. The slew rate control circuit of claim 1, wherein the output impedance enable signal enables the output impedance buffer during the stable time period, and the slew rate enable signal enables the slew rate buffer during the rising or falling time period.

8. The slew rate control circuit of claim 7, wherein the output impedance enable signal further enables the output impedance buffer during the rising or falling time period.

9. A slew rate control circuit, comprising:
an output impedance buffer including a p-type transistor and an n-type transistor connected in series between a positive power supply and a negative power supply;
a slew rate buffer coupled in parallel to the output impedance buffer, the slew rate buffer including a p-type transistor and an n-type transistor connected in series between the positive power supply and the negative power supply; and
an edge detector that detects an input signal to accordingly control the output impedance buffer and the slew rate buffer, such that the input signal is regenerated through the slew rate buffer during a rising or falling time period, and the input signal is only regenerated through the output impedance buffer during a stable time period;
wherein an interconnection node of the p-type transistor and the n-type transistor of the output impedance buffer are coupled to an interconnection node of the p-type transistor and the n-type transistor of the slew rate buffer, and is used as an output of the slew rate control circuit;
wherein the edge detector, according to rising or falling of the input signal, generates at least two output impedance enable signals to respectively enable the p-type transistor and the n-type transistor of the output impedance buffer, and at least two slew rate enable signals to respectively enable the p-type transistor and the n-type transistor of the slew rate buffer.

10. The slew rate control circuit of claim 9, wherein the output of the slew rate control circuit is pulling up or pulling down toward a substantial proportion of a required level during the rising or falling time period, and the output of the slew rate control circuit is substantially maintained at a high or low level during the stable time period.

11. The slew rate control circuit of claim 9, wherein the input signal is further regenerated through the output impedance buffer during the rising or falling time period.

12. The slew rate control circuit of claim 9, wherein an output impedance and slew rate of the slew rate control circuit are in conformity with Mobile Industry Processor Interface (MIPI) specifications.

13. The slew rate control circuit of claim 9, wherein the output impedance buffer has an output impedance greater than the slew rate buffer, and the slew rate buffer has a slew rate greater than the output impedance buffer.

14. The slew rate control circuit of claim 9, wherein the output impedance enable signals enable the output impedance buffer during the stable time period, and the slew rate enable signals enable the slew rate buffer during the rising or falling time period.

15. The slew rate control circuit of claim 14, wherein the output impedance enable signals further enable the output impedance buffer during the rising or falling time period.

* * * * *